United States Patent
Kim

(10) Patent No.: US 10,187,598 B2
(45) Date of Patent: Jan. 22, 2019

(54) CIRCUIT FOR READING-OUT VOLTAGE VARIATION OF FLOATING DIFFUSION AREA, METHOD THEREOF AND CMOS IMAGE SENSOR USING THE SAME

(71) Applicant: SK hynix Inc., Gyeonggi-do (KR)

(72) Inventor: Tae-Gyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/443,416

(22) Filed: Feb. 27, 2017

(65) Prior Publication Data

US 2017/0359543 A1    Dec. 14, 2017

(30) Foreign Application Priority Data

Jun. 13, 2016 (KR) .................. 10-2016-0073229

(51) Int. Cl.
| | |
|---|---|
| *H04N 3/14* | (2006.01) |
| *H04N 5/335* | (2011.01) |
| *H04N 5/378* | (2011.01) |
| *H01L 27/146* | (2006.01) |
| *H04N 5/374* | (2011.01) |

(52) U.S. Cl.
CPC ....... *H04N 5/378* (2013.01); *H01L 27/14643* (2013.01); *H04N 5/374* (2013.01)

(58) Field of Classification Search
CPC ...... H01L 27/148; H04N 5/335; H04N 5/374; H04N 5/378; H04N 5/363; H04N 5/3559; H04N 3/1575
See application file for complete search history.

(56) References Cited

U.S. PATENT DOCUMENTS

| | | | |
|---|---|---|---|
| 2007/0145447 A1 | 6/2007 | Lee et al. | |
| 2008/0258047 A1* | 10/2008 | Sakakibara | G01J 1/44 250/214 C |
| 2011/0187910 A1* | 8/2011 | Nikai | H04N 5/357 348/308 |
| 2012/0218451 A1* | 8/2012 | Rajasekaran | H01L 27/14612 348/302 |
| 2012/0256077 A1* | 10/2012 | Yen | H01L 27/14609 250/208.1 |
| 2013/0141619 A1 | 6/2013 | Lim et al. | |
| 2017/0024868 A1* | 1/2017 | Bock | H04N 5/363 |
| 2017/0187972 A1* | 6/2017 | Murao | H04N 5/363 |
| 2017/0295338 A1* | 10/2017 | Geurts | H04N 5/363 |

* cited by examiner

*Primary Examiner* — Kelly L Jerabek
(74) *Attorney, Agent, or Firm* — IP & T Group LLP

(57) ABSTRACT

A circuit for reading-out a voltage variation of a floating diffusion area includes a reference capacitor suitable for causing a voltage variation of the floating diffusion area based on a charge transfer signal; and a read-out block including the floating diffusion area, and suitable for initializing the floating diffusion area, performing a read-out on an initial voltage of the floating diffusion area and performing a read-out on a varied voltage of the floating diffusion area caused by the reference capacitor.

17 Claims, 4 Drawing Sheets

CIRCUIT FOR READING-OUT VOLTAGE VARIATION OF FLOATING DIFFUSION AREA, METHOD THEREOF AND CMOS IMAGE SENSOR USING THE SAME

CROSS-REFERENCE TO RELATED APPLICATIONS

The present application claims priority to Korean Patent Application No. 10-2016-0073229, filed on Jun. 13, 2016, which is incorporated by reference in its entirety.

BACKGROUND

1. Field

Exemplary embodiments of the present invention relate to a circuit for reading-out a voltage variation of a floating diffusion area capable of extracting a capacitance of the floating diffusion area which determines a conversion gain, a method thereof and a complementary metal oxide semiconductor (CMOS) image sensor using the same.

2. Description of the Related Art

In general, a CMOS image sensor has a low voltage operation, a low power consumption and a high integration as compared to a solid state pick-up device, such as, a charge-coupled device (CCD).

The CMOS image sensor requires an analog-digital conversion of an analog signal outputted from a pixel array, such as, an active pixel sensor (APS), to be converted into a digital signal. Thus, an analog-digital converter having a high resolution is used in the CMOS image sensor.

A capacitance of a floating diffusion area in the CMOS image sensor is a factor for determining a photo conversion gain of a pixel. A main parameter that determines the capacitance of the floating diffusion area includes a junction capacitance, an overlap capacitance, a miller capacitance and an interconnect capacitance.

However, these capacitances may be sensitive to a process variation, a driving voltage and a variation of temperature.

SUMMARY

Various embodiments of the present invention are directed to a circuit for reading-out a voltage variation of a floating diffusion area and which is capable of extracting a capacitance of the floating diffusion area which determines a conversion gain, a method thereof and a CMOS image sensor using the same.

By utilizing a circuit for reading-out voltage variations of the floating diffusion area, a method thereof and a CMOS image sensor using the same in accordance with various embodiments of the present invention, product quality may be evaluated and countermeasures may be setup for a process variation, an operation condition such as a driving voltage variation and a temperature variation of the product.

In an embodiment of the present invention, a circuit for reading-out a voltage variation of a floating diffusion area may include a reference capacitor suitable for causing a voltage variation of the floating diffusion area based on a charge transfer signal; and a read-out block including the floating diffusion area, and suitable for initializing the floating diffusion area, performing a read-out on an initial voltage of the floating diffusion area and performing a read-out on a varied voltage of the floating diffusion area caused by the reference capacitor.

The reference capacitor may be coupled to the floating diffusion area and causes the voltage variation of the floating diffusion area according to the charge transfer signal.

The read-out block may include a reset transistor suitable for initializing the floating diffusion area; a drive transistor suitable for generating a first electrical signal corresponding to the initial, voltage of the floating diffusion area, and generating a second electrical signal corresponding to the varied voltage of the floating diffusion area; and a selection transistor suitable for outputting the first and second electrical signals as a pixel signal.

The reset transistor may be coupled between the floating diffusion area and a ground power supply voltage, and initialize the floating diffusion area to the ground power supply voltage, wherein the drive transistor may be coupled to the floating diffusion area at its gate and be coupled to a power supply voltage, and generate the first and second electrical signals according to the initial voltage and the varied voltage of the floating diffusion area and the power supply voltage, and wherein the selection transistor may be serially coupled to the drive transistor and output the first and second electrical signals as the pixel signal.

The circuit for reading-out a voltage variation may be formed as a dummy pixel.

In another embodiment of the present invention, a voltage variation read-out method for a floating diffusion area may include initializing the floating diffusion area; performing a first read-out operation on an initial voltage of the floating diffusion area; varying a voltage of the floating diffusion area; and performing a second read-out operation on the varied voltage of the floating diffusion area.

The initializing of the floating diffusion area may include initializing the floating diffusion area using a ground power supply voltage.

The performing of the first read-out operation may include performing the first read-out operation on an initial voltage value of the floating diffusion area when the floating diffusion area is initialized.

The performing of the second read-out operation may include receiving a charge transfer signal from a reference transistor, and performing the second read-out operation on the varied voltage value of the floating diffusion area if the voltage value of the floating diffusion area is varied by the charge transfer signal applied to a reference capacitor.

The performing of the second read-out operation may include receiving the charge transfer signal from a control unit.

The performing of the first read-out operation may include generating a first electrical signal corresponding to the initial voltage.

The performing of the second read-out operation ay include generating a second electrical signal corresponding to the varied voltage.

The varying of the voltage of the floating diffusion area may be performed through a reference capacitor, which is coupled to the floating diffusion area, and wherein the reference capacitor may perform the varying of the voltage of the floating diffusion area according to a charge transfer signal.

The voltage variation read-out method for the floating diffusion may further include calculating a capacitance of the floating diffusion area using the charge transfer signal, a capacitance of the reference capacitor and the first and second electrical signals.

In another embodiment of the present invention, a complementary meta oxide semiconductor (CMOS) image sensor may include an active pixel array for outputting a pixel signal corresponding to an incident light; and a dummy pixel array for performing a read-out operation on a voltage of a floating diffusion area.

Each of a plurality of pixels in the dummy pixel array may include a reference capacitor suitable for causing a voltage variation of the floating diffusion area according to a charge transfer signal; and a read-out block including the floating diffusion area, and suitable for initializing the floating diffusion area, performing a read-out on an initial voltage of the floating diffusion area and performing a read-out on a varied voltage of the floating diffusion area caused by the reference capacitor.

The reference capacitor may be coupled to the floating diffusion area and causes the voltage variation of the floating diffusion area according to the charge transfer signal.

The read-out block may include a reset transistor suitable for initializing the floating diffusion area; a drive transistor suitable for generating a first electrical signal corresponding to the initial voltage of the floating diffusion area, and generating a second electrical signal corresponding to the varied voltage of the floating diffusion area; and a selection transistor suitable for outputting the first and second electrical signals as a pixel signal.

The reset transistor may be coupled between the floating diffusion area and a ground power supply voltage, and initialize the floating diffusion area to the ground power supply voltage, wherein the drive transistor may be coupled to the floating diffusion area at its gate and coupled to a power supply voltage, and generate the first and second electrical signals according to the initial voltage and the varied voltage of the floating diffusion area and the power supply voltage, and wherein the selection transistor may be serially coupled to the drive transistor and output the first and second electrical signals as the pixel signal.

DETAILED DESCRIPTION

Figure 1:
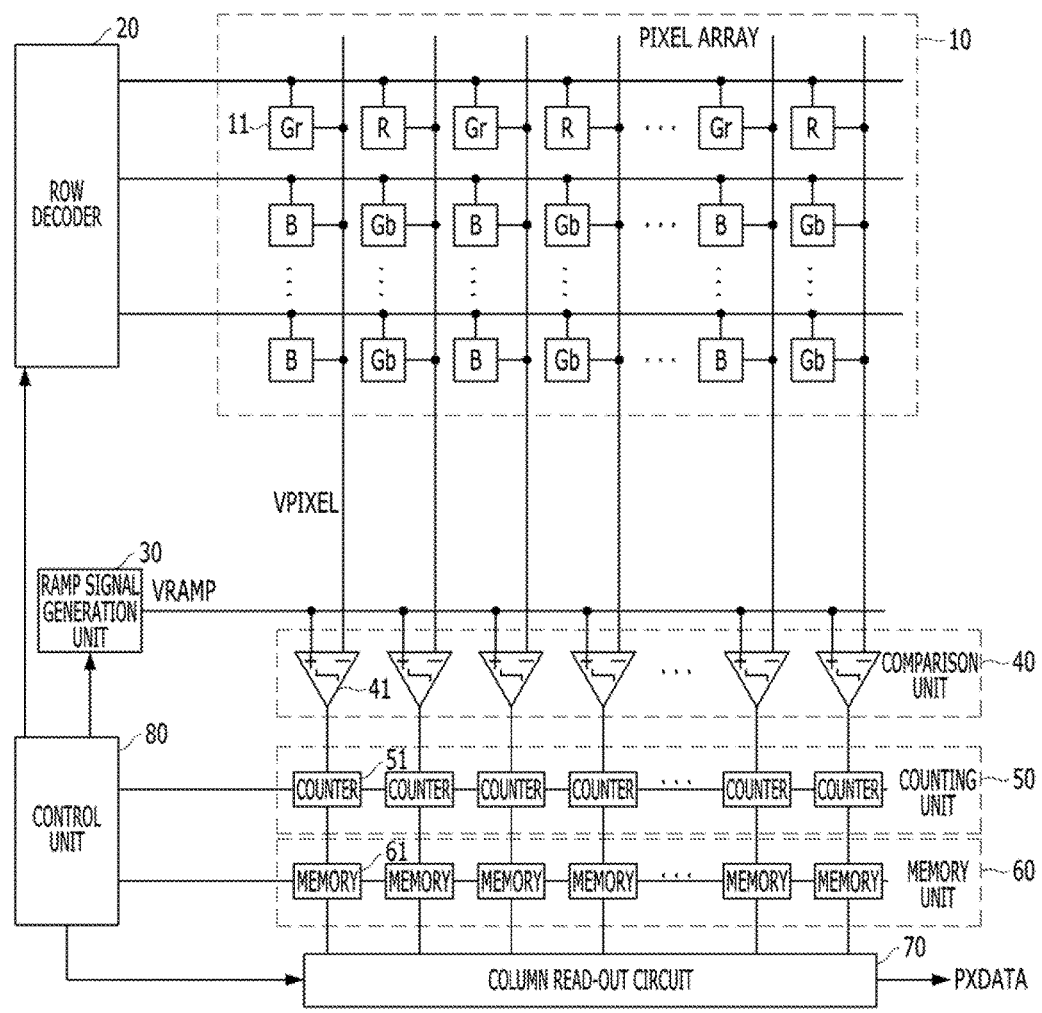
FIG. 1 is a block diagram illustrating a typical CMOS image sensor.

Various embodiments of the present invention will be described below in more detail with reference to the accompanying drawings. The present invention may, however be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Throughout the specification, when an element is referred to as being "coupled" to another element, it may not only indicate that the elements are "directly coupled" to each other, but also indicate that the elements are "electrically coupled" to each other with another element interposed therebetween.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily drawn to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art, and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail to avoid unnecessarily obscuring the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a typical CMOS image sensor.

Referring to FIG. 1, the CMOS image sensor includes a pixel array 10, a row decoder 20, a ramp signal generation unit 30, a comparison unit 40, a counting unit 50, a memory unit 60, a column read-out circuit 70 and a control unit 80.

The pixel array 10 outputs a pixel signal VPIXEL corresponding to an incident light. The row decoder 20 selects and controls a pixel of a pixel array row by row according to a control of the control unit 80.

The ramp signal generation unit 30 generates a ramp signal VRAMP according to a control of the control unit 80. The comparison unit 40 compares the ramp signal VRAMP with the pixel signal VPIXEL.

The counting unit 50 counts a clock of the control unit 80 according to respective output signals outputted from the comparison unit 40. The memory unit 60 stores the counting information outputted from the counting unit 50.

The column read-out circuit 70 sequentially outputs the stored data of the memory unit 60 as pixel data PXDATA according to the control of the control unit 80. The control unit 80 controls operations of the row decoder 20, the ramp signal generation unit 30, the counting unit 50, the memory unit 60 and the column read-out circuit 70.

Herein, generally, in order to remove an offset value of a pixel in a CMOS image sensor, only a pixel signal VPIXEL, which is caused by an incident light is measured by comparing a pixel signal VPIXEL before and after the incident light is inputted. This manner is referred to as a correlated double sampling (CDS). This CDS operation is performed in the comparison unit 40.

The comparison unit 40 includes a plurality of comparators, the counting unit 50 includes a plurality of counters, and the memory unit 60 includes a plurality of memories. One of the plurality of comparators, one of the plurality of counters and one of the plurality of memories are used at each columns.

A first comparator 41 among the plurality of comparators receives the pixel signal VPIXEL outputted from first column of the pixel array 10 through an inverting terminal of the first comparator 41, and receives the ramp signal VRAMP outputted from the ramp signal generation unit 30 through a non-inverting terminal of the first comparator 41. The first comparator 41 compares the ramp signal VRAMP with the pixel signal VPIXEL outputted from the first column of the pixel array 10, and outputs a comparison.

Herein, since a voltage level of the ramp signal VRAMP is increased or decreased as a time elapses while the ramp signal VRAMP stays constant, there is a time point when the levels of the ramp signal and the pixel signal VPIXEL are the same and then the comparison signal is inverted due to voltage level reversal of the ramp signal VRAMP and the pixel signal VPIXEL.

Thus, a first counter 51 among the plurality of counters counts the clock outputted from the control unit 80, and outputs the counting information from the rising time or the falling time of the ramp signal VRAMP to the inversion time of the comparison signal outputted from the first comparator 41. Herein each counter is reset in response to a reset signal outputted from the control unit 80.

A first memory 61 among the plurality of memories stores the counting information outputted from the first counter 51 according to a load signal of the control unit 80, and outputs the counting information to the column read-out circuit 70.

Figure 2:
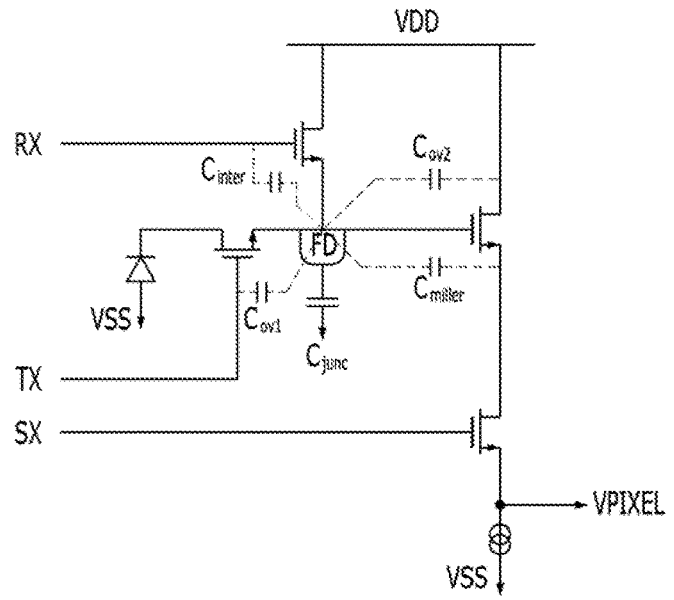
FIG. 2 is a circuit diagram illustrating a unit pixel shorn in FIG. 1.
Figure 3:
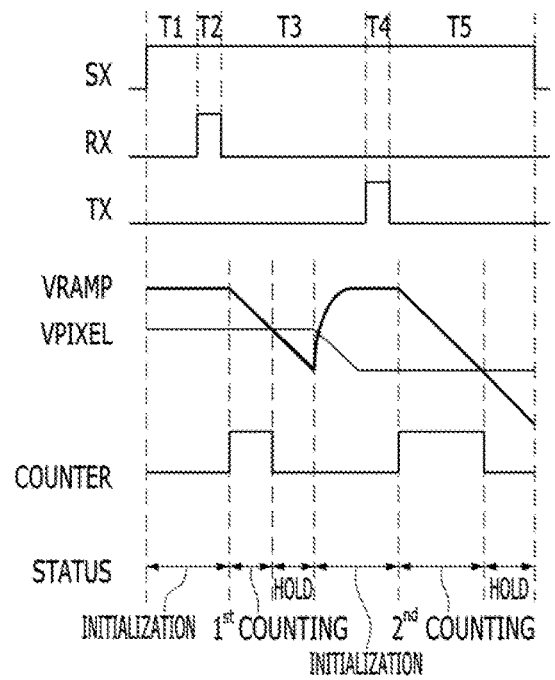
FIG. 3 is a timing diagram illustrating the typical CMOS image sensor and the unit pixel shown in FIGS. 1 and 2.

FIG. 2 is a circuit diagram illustrating a unit pixel shown in FIG. 1. FIG. 3 is a timing diagram illustrating the typical CMOS image sensor and the unit pixel shown in FIGS. 1 and 2. That is, FIG. 3 shows a timing diagram illustrating an operation of the typical CMOS image sensor.

Herein, the plurality of operation sections include a corresponding row line selection operation section T1, a photodiode reset and pixel reset data transfer operation section T2, a pixel reset data code conversion operation section T3, a pixel reception data transfer operation section T4 and a pixel reception data code conversion operation section T5, which are sequentially performed.

During a row line selection operation section T1, a row line is selected by a selection signal. During a photodiode reset and pixel reset data transfer operation section T2, a voltage of a floating diffusion area FD is reset in response to a reset control signal RX, and a voltage of the floating diffusion area FD is determined by a reset voltage of the reset control signal RX. The reset voltage is transferred as a pixel signal VPIXEL through a drive transistor, for example, a source follower transistor. Herein, the photodiode determines the voltage of the floating diffusion area FD.

During a pixel reset data code conversion operation section T3, a reset transistor and a transfer transistor are switched off and the pixel signal VPIXEL or the reset output voltage of the pixel is converted.

FIG. 2 shows a structure of a unit pixel shown in FIG. 1.

In general, a capacitance $C_{FD}$ of a floating diffusion area FD in the unit pixel of the CMOS image sensor is a factor for determining a photo-electric conversion gain of the unit pixel. The capacitance $C_{FD}$ of the floating diffusion area FD is expressed by the following equation 1.

$$C_{FD}=C_{junc}+C_{OV}(=C_{OV1}+C_{OV2})+C_{miller}+C_{inter} \quad \text{[Equation 1]}$$

In equation 1, "$C_{junc}$" represents a junction capacitance, "$C_{OV}$" represents an overlap capacitance, "$C_{OV1}$" represents a first overlap capacitance, "$C_{OV2}$" represents a second overlap capacitance, and "$C_{miller}$" represents a miller capacitance and "$C_{inter}$" represents an interconnect capacitance.

However, there are disadvantages with typical CMOS image sensors since these capacitances may be sensitive to a process variation, a driving voltage and a variation of temperature.

Thus, in an embodiment of the present invention, a capacitance $C_{FD}$ of the floating diffusion area FD may be obtained by reading-out a voltage variation of the floating diffusion area FD using a reference capacitor and a charge transfer signal. The detailed descriptions of the embodiment of the present invention will follow as below with reference to FIGS. 4A to 4C.

Figure 4A:
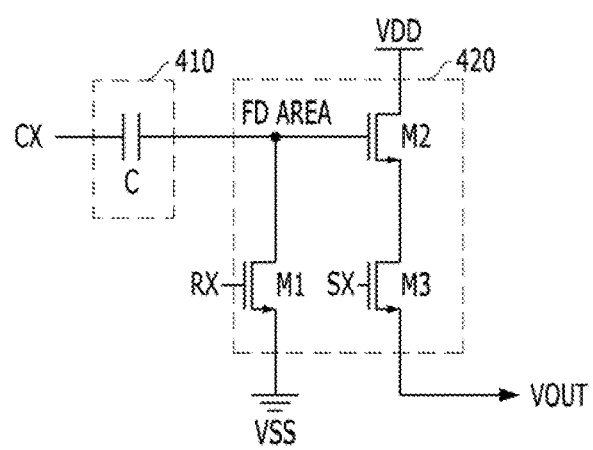
FIG. 4A is a circuit diagram illustrating a circuit for reading-out a voltage variation of a floating diffusion area in accordance with an embodiment of the present invention.
Figure 4B:
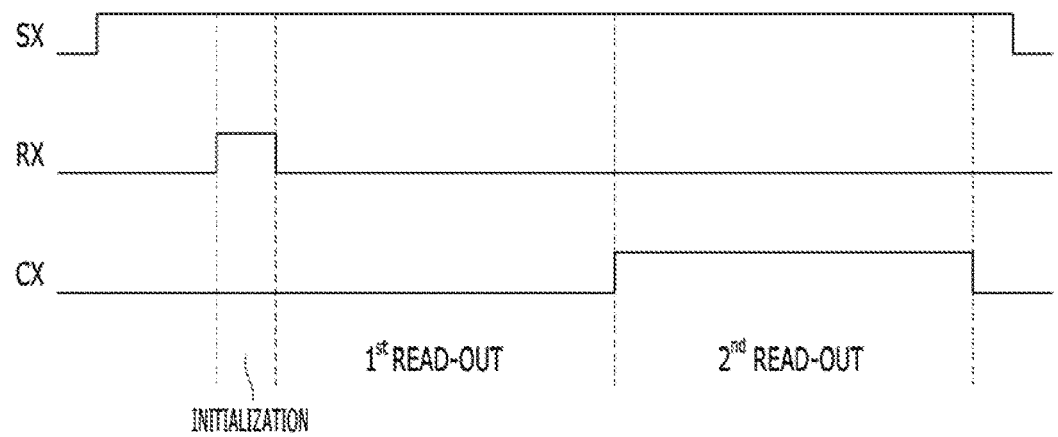
FIG. 4B is a timing diagram illustrating the circuit for reading-out a voltage variation of the floating diffusion area shown in FIG. 4A.
Figure 4C:
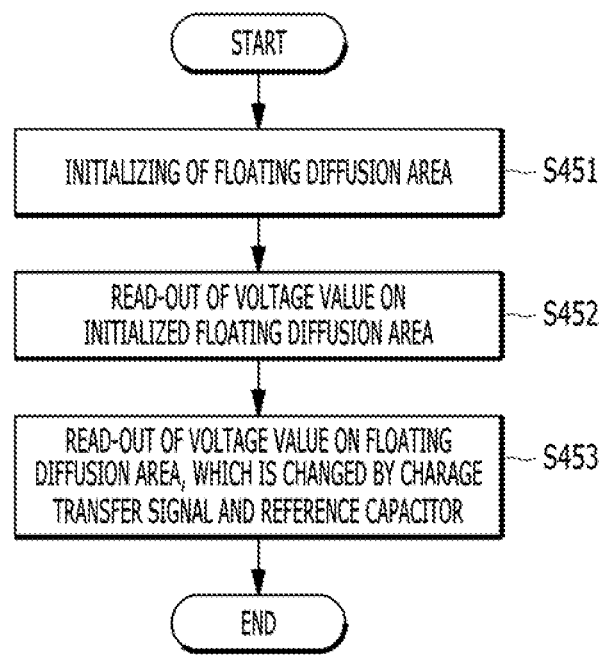
FIG. 4C is a flow charge illustrating an operation method for the circuit for reading-out a voltage variation shown in FIG. 4A.

FIG. 4A is a circuit diagram illustrating, a circuit for reading-out a voltage variation of the floating diffusion area in accordance with an embodiment of the present invention. FIG. 4B is a timing diagram illustrating the circuit for reading-out a voltage variation of the floating diffusion area shown in FIG. 4A. FIG. 4C is a flow charge illustrating an operation method for the circuit for reading-out a voltage variation shown in FIG. 4A.

Herein, a reset control signal RX and a selection control signal SX shown in FIGS. 4A and 4B may be provided from the row decoder 20, and a charge transfer signal CX may be provided from the control unit 80.

Referring to FIG. 4A, the circuit for reading-out a voltage variation of the floating diffusion area includes a reference capacitor 410, a read-out block 420, and a floating diffusion area FD. The circuit for reading-out a voltage variation of the floating diffusion area may be implemented in the form of a dummy pixel and be arranged in a dummy pixel array area, which is located at a left side or a right side of an active pixel array area. Therefore, the circuit for reading-out a voltage variation of the floating diffusion area includes the floating diffusion area FD which is the same as the pixels of the active pixel array area.

The reference capacitor 410 causes a voltage variation of the floating diffusion area FD corresponding to the charge transfer signal CX.

More specifically, the reference capacitor 410 transfers the charge transfer signal CX from the control unit 80 to the floating diffusion area FD of the read-out block 420. And, the reference capacitor 410 has a predetermined capacitance.

The read-out block 420 includes a reset transistor M1, a drive transistor M2 and a selection transistor M3.

The reset transistor M1 initializes the floating diffusion area FD of the circuit for reading-out a voltage variation of the floating diffusion area according to the reset control signal RX. The drive transistor M2 generates a first electrical signal corresponding to an initial voltage of the floating diffusion area FD, and generates a second electrical signal corresponding to a changed voltage of the floating diffusion area FD due to the charge transfer signal CX provided through the reference capacitor 410. The selection transistor M3 outputs the first and second electrical signals as an output signal VOUT of the circuit for reading-out a voltage variation of the floating diffusion area according to the selection control signal SX. The output signal VOUT of the circuit for reading-out a voltage variation of the floating diffusion area is converted into digital signals by an analog-digital converting device, and then, the converted digital signals may be stored in a storage unit, such as a look-up table, and be transferred to an image signal processor.

The read-out block 420 is coupled between a power supply voltage VDD and a ground power supply voltage VSS. The read-out block 420 is also coupled to the floating diffusion area FD.

The drive transistor M2 and the selection transistor M3 are serially coupled to each other between the power supply voltage VDD and an output node of the read-out block 420. The drive transistor M2 is coupled to the power supply voltage VDD and the selection transistor M3 is coupled to the output node of the read-out block 420.

The drive transistor M2 receives the voltage of the floating diffusion area FD at its gate, and generates the first and second electrical signals corresponding to the initial and changed voltages of the floating diffusion area FD.

The selection transistor M3 outputs the first and second electrical signals as the output signal VOUT of the circuit for reading-out a voltage variation of the floating diffusion area in response to the selection control signal SX. In another embodiment of the present invention, the circuit for reading-out a voltage variation of the floating diffusion area may be implemented with a dummy pixel type and be arranged in a dummy pixel array area.

At step S451, the circuit for reading-out a voltage variation of the floating diffusion area initializes the floating diffusion area FD.

That is the circuit for reading-out a voltage variation of the floating diffusion area initializes the floating diffusion area FD using the ground power supply voltage VSS by switching on the reset transistor M1. More specifically, while the selection transistor M3 is switched on and the charge transfer signal CX has a low voltage level, the reset transistor M1 is switched on in response to the reset control signal RX having a high voltage level to initialize the voltage level of the floating diffusion area FD to the ground power voltage VSS.

At step S452, the circuit for reading-out a voltage variation of the floating diffusion area reads out a voltage of the initialized floating diffusion area FD.

That is, the circuit for reading-out a voltage variation of the floating diffusion area read out the voltage level of the initialized floating diffusion area FD. More specifically, while the selection transistor M3 is switched on and the charge transfer signal CX has a low voltage level, the reset transistor M1 is switched off according to the reset control signal RX. During this state, the drive transistor M2 generates the first electrical signal corresponding to the voltage of the initialized floating diffusion area FD and the turned on selection transistor M3 outputs the first electrical signal as the output signal VOUT of the circuit for reading-out a voltage variation of the floating diffusion area.

At step S453, the circuit for reading-out a voltage variation of the floating diffusion area reads out a changed voltage of the floating diffusion area due to the reference capacitor 410 and the charge transfer signal CX.

If the voltage of the floating diffusion area FD is changed according to the charge transfer signal CX applied to the reference capacitor 410, the circuit for reading-out a voltage variation reads out the changed voltage of the floating diffusion area FD. More specifically, while the selection transistor M3 is switched on, the reset transistor M1 is switched off, and the charge transfer signal CX is changed from a low level signal to a high level signal, the voltage of the floating diffusion area FD is changed due to the charge transfer signal CX transferred through the reference capacitor 410. Then, the drive transistor M2 generates the second electrical signal corresponding to the changed voltage of the floating diffusion area FD and the turned on selection transistor M3 outputs the second electrical signal as the output signal VOUT of the circuit for reading-out a voltage variation of the floating diffusion area.

As described above, in the embodiment of the present invention, by performing a first read-out operation on an initial voltage of the floating diffusion area and performing a second read-out operation on a changed voltage due to a reference capacitor and a charge transfer signal, a capacitance of the floating diffusion area may be calculated on the basis of the first and second electrical signals corresponding to the first and second read-out operations, a capacitance of the reference capacitor and the charge transfer signal during a post processing operation of an image signal processor.

That is, when the capacitance of the reference capacitor is given and the charge transfer signal has a low voltage level after the initialization operation, the initial voltage of the floating diffusion area may be read-out according to the given capacitance of the reference capacitor and the capacitance of the floating diffusion area, and when the charge transfer signal is changed to have a high voltage level, the changed voltage of the floating diffusion area may be read-out according to the given capacitance of the reference capacitor and the capacitance of the floating diffusion area.

Thus, the capacitance of the floating diffusion area may be calculated by the image signal processor.

Although various embodiments of the present invention have been described for illustrative purposes, it will be apparent to those skilled in the art that various changes and modifications may be made without departing from the spirit and scope of the invention as defined in the following claims.

What is claimed is:

1. A circuit for reading-out a voltage variation of a floating diffusion area, comprising:
   a reference capacitor suitable for causing a voltage variation of the floating diffusion area based on a charge transfer signal provided from a control unit; and
   a read-out block including the floating diffusion area, and suitable for initializing the floating diffusion area, performing a read-out on an initial voltage of the floating diffusion area and performing a read-out on a varied voltage of the floating diffusion area caused by the reference capacitor,
   wherein the read-out block includes:

a reset transistor coupled between the floating diffusion area and a terminal for supplying a ground power supply voltage, and suitable for initializing the floating diffusion area to the ground power supply voltage.

2. The circuit for reading-out a voltage variation of the floating diffusion area of claim 1, wherein the reference capacitor is coupled to the floating diffusion area and causes the voltage variation of the floating diffusion area according to the charge transfer signal.

3. The circuit for reading-out a voltage variation of the floating diffusion area of claim 2, wherein the read-out block further includes:
a drive transistor suitable for generating a first electrical signal corresponding to the initial voltage of the floating diffusion area, and generating a second electrical signal corresponding to the varied voltage of the floating diffusion area; and
a selection transistor suitable for outputting the first and second electrical signals as a pixel signal.

4. The circuit for reading-out a voltage variation of the floating diffusion area of claim 3,
wherein the drive transistor is coupled to the floating diffusion area at its gate and is coupled to a power supply voltage, and generates the first and second electrical signals according to the initial voltage and the varied voltage of the floating diffusion area and the power supply voltage, and
wherein the selection transistor is serially coupled to the drive transistor and outputs the first and second electrical signals as the pixel signal.

5. The circuit for reading-out a voltage variation of the floating diffusion area of claim 1, wherein the circuit for reading-out a voltage variation is formed as a dummy pixel.

6. A voltage variation read-out method for a floating diffusion area, comprising:
initializing the floating diffusion area to a ground power supply voltage by using a reset transistor coupled between the floating diffusion area and a terminal for supplying the ground power supply voltage;
performing a first read-out operation on an initial voltage of the floating diffusion area;
varying a voltage of the floating diffusion area; and
performing a second read-out operation on the varied voltage of the floating diffusion area.

7. The voltage variation read-out method of the floating diffusion of claim 6, wherein the performing of the first read-out operation includes performing the first read-out operation on an initial voltage value of the floating diffusion area when the floating diffusion area is initialized.

8. The voltage variation read-out method of the floating diffusion of claim 6, wherein the performing of the second read-out operation includes receiving a charge transfer signal from a reference transistor, and performing the second read-out operation on the varied voltage value of the floating diffusion area if the voltage value of the floating diffusion area is varied by the charge transfer signal applied to a reference capacitor.

9. The voltage variation read-out method of the floating diffusion of claim 8, wherein the performing of the second read-out operation includes receiving the charge transfer signal from a control unit.

10. The voltage variation read-out method for the floating diffusion of claim 6, wherein the performing of the first read-out operation includes generating a first electrical signal corresponding to the initial voltage.

11. The voltage variation read-out method for the floating diffusion of claim 10, wherein the performing of the second read-out operation includes generating a second electrical signal corresponding to the varied voltage.

12. The voltage variation read-out method for the floating diffusion of claim 11,
wherein the varying of the voltage of the floating diffusion area is performed through a reference capacitor, which is coupled to the floating diffusion area, and
wherein the reference capacitor performs the varying of the voltage of the floating diffusion area according to a charge transfer signal.

13. The voltage variation read-out method for the floating diffusion of claim 12, further comprising calculating a capacitance of the floating diffusion area using the charge transfer signal, a capacitance of the reference capacitor and the first and second electrical signals.

14. A complementary metal oxide semiconductor (CMOS) image sensor, comprising:
an active pixel array for outputting a pixel signal corresponding to an incident light; and
a dummy pixel array for performing a read-out operation on a voltage of a floating diffusion area,
wherein each of a plurality of pixels in the dummy pixel array includes:
a reference capacitor suitable for causing a voltage variation of the floating diffusion area according to a charge transfer signal; and
a read-out block including the floating diffusion area, and suitable for initializing the floating diffusion area, performing a read-out on an initial voltage of the floating diffusion area and performing a read-out on a varied voltage of the floating diffusion area caused by the reference capacitor,
wherein the read-out block includes:
a reset transistor coupled between the floating diffusion area and a terminal for supplying a ground power supply voltage, and suitable for initializing the floating diffusion area to the ground power supply voltage.

15. The CMOS image sensor of claim 14, wherein the reference capacitor is coupled to the floating diffusion area and causes the voltage variation of the floating diffusion area according to the charge transfer signal.

16. The CMOS image sensor of claim 15, wherein the read-out block further includes:
a drive transistor suitable for generating a first electrical signal corresponding to the initial voltage of the floating diffusion area, and generating a second electrical signal corresponding to the varied voltage of the floating diffusion area; and
a selection transistor suitable for outputting the first and second electrical signals as a pixel signal.

17. The CMOS image sensor of claim 16,
wherein the drive transistor is coupled to the floating diffusion area at its gate and coupled to a power supply voltage, and generates the first and second electrical signals according to the initial voltage and the varied voltage of the floating diffusion area and the power supply voltage, and
wherein the selection transistor is serially coupled to the drive transistor and outputs the first and second electrical signals as the pixel signal.

* * * * *